US009296065B2

United States Patent
Hesse et al.

(10) Patent No.: US 9,296,065 B2
(45) Date of Patent: Mar. 29, 2016

(54) METHOD FOR ULTRASONIC BONDING HAVING AT LEAST ONE FIRST AND SECOND ULTRASONIC TRANSDUCER GENERATING HARMONIC OSCILLATION COMPONENTS

(75) Inventors: Hans-Juergen Hesse, Paderborn (DE); Michael Broekelmann, Delbrueck (DE)

(73) Assignee: HESSE GMBH, Paderborn (DE)

( * ) Notice: Subject to any disclaimer, the term of this patent is extended or adjusted under 35 U.S.C. 154(b) by 64 days.

(21) Appl. No.: 14/131,930

(22) PCT Filed: Jul. 26, 2012

(86) PCT No.: PCT/DE2012/000753
§ 371 (c)(1),
(2), (4) Date: Jan. 10, 2014

(87) PCT Pub. No.: WO2013/020539
PCT Pub. Date: Feb. 14, 2013

(65) Prior Publication Data
US 2014/0151439 A1    Jun. 5, 2014

(30) Foreign Application Priority Data

Aug. 5, 2011    (DE) .................... 10 2011 080 534

(51) Int. Cl.
*B23K 20/00* (2006.01)
*B23K 20/10* (2006.01)
*B06B 1/06* (2006.01)

(52) U.S. Cl.
CPC ............... *B23K 20/10* (2013.01); *B06B 1/0607* (2013.01); *H01L 2224/83097* (2013.01); *H01L 2224/83099* (2013.01); *H01L 2224/83206* (2013.01); *H01L 2224/83207* (2013.01); *H01L 2224/83208* (2013.01); *H01L 2924/0002* (2013.01)

(58) Field of Classification Search
CPC ........... H01L 2224/48463; H01L 2224/78301; H01L 2224/85205; H01L 24/78; H01L 2924/20305; B23K 20/007; B23K 20/10; B23K 20/106; B23K 2201/42; B06B 1/0607; B06B 3/00
See application file for complete search history.

(56) References Cited

U.S. PATENT DOCUMENTS

| 5,578,888 | A | 11/1996 | Safabakhsh | |
|---|---|---|---|---|
| 2003/0168938 | A1* | 9/2003 | Wallaschek et al. | 310/328 |
| 2011/0315743 | A1* | 12/2011 | Maruya et al. | 228/102 |

FOREIGN PATENT DOCUMENTS

| EP | 1317990 | A1 | 11/2002 |
|---|---|---|---|
| JP | 3016685 | A | 2/1991 |
| JP | 564465 | A | 12/1993 |
| JP | 05064465 | A | 12/1993 |
| JP | 2010199142 | A * | 9/2010 |

* cited by examiner

*Primary Examiner* — Erin Saad
(74) *Attorney, Agent, or Firm* — Karl F. Milde, Jr.; Eckert Seamans Cherin & Mellott, LLC

(57) ABSTRACT

In a method for ultrasonic bonding, two longitudinal ultrasonic waves propagating in a common working plane oriented parallel to a substrate are induced in one or more ultrasonic transducers and are passed through ultrasound-conducting arms from different spatial directions onto a common connection point of the arms. At the connection point the ultrasonic waves cause an ultrasonic tool arranged directly or indirectly at said connection point to oscillate in two or three dimensions. At least one of the ultrasonic transducers induces an ultrasonic wave with a first harmonic oscillation component and a second oscillation component.

11 Claims, 4 Drawing Sheets

METHOD FOR ULTRASONIC BONDING HAVING AT LEAST ONE FIRST AND SECOND ULTRASONIC TRANSDUCER GENERATING HARMONIC OSCILLATION COMPONENTS

BACKGROUND OF THE INVENTION

The invention relates to a method for ultrasonic bonding, wherein two longitudinal ultrasonic waves propagating in a common working plane oriented parallel to a substrate are induced in one or more ultrasonic transducers and are passed through ultrasound-conducting arms from different spatial directions onto a common connection point of the arms, and at the connection point cause an ultrasonic tool arranged directly or indirectly at said connection point to oscillate in two or three dimensions.

In addition, the invention relates to a device for carrying out the bonding method.

Known from EP 1,317,990 A1 is a so-called ultrasonic cross-transducer having at least two ultrasonic transducers associated with a common working plane for generating two ultrasonic longitudinal waves in a working plane oriented parallel to a substrate. The ultrasonic waves generated in the ultrasonic transducers are guided by arms that are assigned to the ultrasonic transducers and that are conducting the ultrasound from different spatial directions onto a connection point of the arms and from there are passed on directly or indirectly via a connection element to an ultrasonic tool. Preferably, the ultrasonic tool protrudes at a right angle from the working plane of the ultrasonic transducer in the direction of the substrate. The tool is induced into bending oscillations. Due to the bending oscillation, a tool tip facing the substrate carries out a movement, which is transferred contact-based to a component, for example a semiconductor chip or a bond wire, that is to be connected to the substrate. The friction movement between substrate and component creates a metallic connection by friction welding in the contact area. By the angular offset arrangement of the ultrasonic transducers to each another—preferably four ultrasonic transducers are provided that are arranged at respective 90° angles to each other—a two-dimensional ultrasonic oscillation can be generated in the working plane and transferred to the component. While in one-dimensional ultrasonic bonding methods a time-varying relative speed and acceleration occurs between substrate and component, and a transition from static friction to sliding friction occurs at every point of a movement-reversal, when using the ultrasonic cross transducers, a constant speed or acceleration amount between the substrate and component can be reached and a constant change between static and sliding friction can be avoided. This reduces the mechanical stress on the components that are to be bonded with the substrate, making the method particularly well suited for bonding of dedicate semiconductor chips. Because of the no longer existing static to sliding transitions, a higher mechanical output power is available for carrying out the welding process using the same electrical power input. The same friction energy required for the bonding formation can then be achieved with smaller amplitudes in less time. This is particularly advantageous because the total friction work to be performed increases as well in the flip chip technology as a result of an increase of the electrical contacts per chip, and therefore, the welding power must be increased at a constant cycle time in order to weld chips having a large number of electrical contacts. The work carried out during a cycle of the harmonic oscillation of the system at the welding point is proportional to the radius of the circle or to the semi-axes of the ellipses, respectively, of the self-adjusting movement, and these are limited by the maximum achievable amplitude of the ultrasonic transducers.

SUMMARY OF THE INVENTION

The objective of the present invention is therefore to improve a method for ultrasonic bonding such that the welding power is increased at a constant movement amplitude or that the movement amplitude can be reduced at a constant welding power and that transitions from static to sliding friction are avoided.

This objective, as well as other objectives which will become apparent from the discussion that follows, is achieved, according to the present invention, by providing a method of ultrasonic bonding wherein at least one ultrasonic transducer generates an ultrasonic wave with a first harmonic oscillation component and with a second oscillation component.

The particular advantage of the invention is that at a constant normal force and constant amplitude of the first harmonic, a higher welding power can be introduced into the bond contact by multiplying the amplitude with a higher harmonic or by adding a higher harmonics with smaller amplitude, respectively, into the bond contact. This makes it possible to shorten the cycle times, or with the same amplitude (i.e., at about a constant mechanical stress of the chip) to provide the bonding energy also for larger areas.

For example, a single ultrasonic transducer can be provided, which provides a multi-harmonic or multi-frequency excitation.

For example, the first harmonic oscillation component of two ultrasonic transducers spatially offset to each other by 90° and controlled with a 90° temporal phase offset can be used to form a base oscillation by merging sine and cosine oscillations, where at said base oscillation the tool tip facing the substrate carries out a movement with a trajectory that has the form of a circle, an ellipse or any other Lissajous figure on the substrate. Frequency and amplitude of the first harmonic oscillation components may, for example, correspond to those of modern ultrasonic transducers. In addition to the first harmonic oscillation component, a second oscillation component is superimposed on one or both transducers. The additive superimposition of the second oscillation component causes the path traversed by the tip of the tool and thus the welding work done in a cycle, which is calculated as the integral of the product of the friction force and the web speed, to increase at otherwise constant process parameters per unit of time.

According to a preferred embodiment of the invention, the ultrasonic transducer generates the second oscillation component as a second harmonic oscillation component. Advantageously, resonant harmonic oscillations can be induced relatively easily, thus simplifying the design of the cross transducer.

According to another embodiment of the invention, the at least one ultrasonic transducer generates an ultrasonic wave with a second oscillation component of higher frequency compared to the first harmonic oscillation component. Optionally, the first harmonic oscillation component has a first oscillation amplitude and the second oscillation component has a second amplitude that is smaller compared to the first amplitude. For example, the second oscillation component can have a frequency that is 2 to 100 times higher than that of the first oscillation component. Preferably, the second oscillation component has a frequency that is greater than the frequency of the first harmonic oscillation component, while the oscillation amplitude of the second oscillation component is smaller than the oscillation amplitude of the first harmonic oscillation component. This advantageously creates the possibility of significantly increasing the path traveled by the tip of the tool in each unit of time at an approximately constant amplitude of the main oscillation (first oscillation component). For example, the path can be approximately doubled by the frequency of the second oscillation component being ten times greater than the frequency of the first oscillation component and by the amplitude of the second oscillation component being smaller than the amplitude of the first oscillation component by a factor of approximately 3. Since the period remains constant, the welding power doubles with the path as well.

According to another embodiment of the invention, a first ultrasonic transducer is induced by an ultrasonic wave having a first harmonic oscillation component and a second oscillation component—and at least one second ultrasonic transducer is induced by an ultrasonic wave having a first harmonic oscillation component and a second oscillation component. The transducers may be arranged in the plane in different ways. Typically, adjacent ultrasonic transducers can be arranged in the working plane at an angle of 30° to 150° to each other. Advantageously, control of the ultrasonic transducers and excitation of the tool become easier by a regular, in particular symmetrical arrangement thereof. The ultrasonic cross transducer can be controlled in a comparatively simple manner. Moreover, the design of the entire bonding machine is simplified if the transducer can be designed approximately symmetrical. In this case, the reaction forces can be controlled well or balance out in part, with the result that the supports can be made smaller and the moving masses can be reduced.

According to a further embodiment of the invention, the first ultrasonic transducer and the second ultrasonic transducer are arranged at an angle of 90° toward each other, wherein the second oscillation component of the first ultrasonic wave is formed orthogonal to the second oscillation component of the second ultrasonic wave. Providing second oscillation components that are orthogonal to each other simplifies bringing together the ultrasonic waves of the first and second ultrasonic transducer at the connection point.

According to another embodiment of the invention, the at least one ultrasonic transducer generates at least one ultrasonic wave with a third oscillation component. The third oscillation component can be generated, for example, as a harmonic third oscillation component with a higher oscillation frequency compared to the second oscillation component. The ultrasonic transducer can advantageously be induced, for example, by a multiplicative superimposition of two oscillation excitations with different frequencies. This is easy to implement especially in the area of signal generation. The second oscillation component and the third oscillation component can exhibit equal amplitudes.

According to another embodiment of the invention, the at least one ultrasonic oscillator is induced to generate the first harmonic oscillation to oscillate at a first form of natural oscillation and to generate the second oscillation component and/or the third oscillation component to oscillate at least at one other form of natural oscillation of a higher order. Advantageously, the natural oscillations of the ultrasonic transducer can be induced reproducibly with comparatively low energy. The natural oscillations are stable, so that the ultrasonic process has a high degree of stability and reproducibility. The form of natural oscillation associated with the first oscillation component does not have to be the smallest form of natural oscillation of the ultrasound transducer.

For a full understanding of the present invention, reference should now be made to the following detailed description of the preferred embodiments of the invention as illustrated in the accompanying drawings.

DESCRIPTION OF THE PREFERRED EMBODIMENTS

Figure 1:
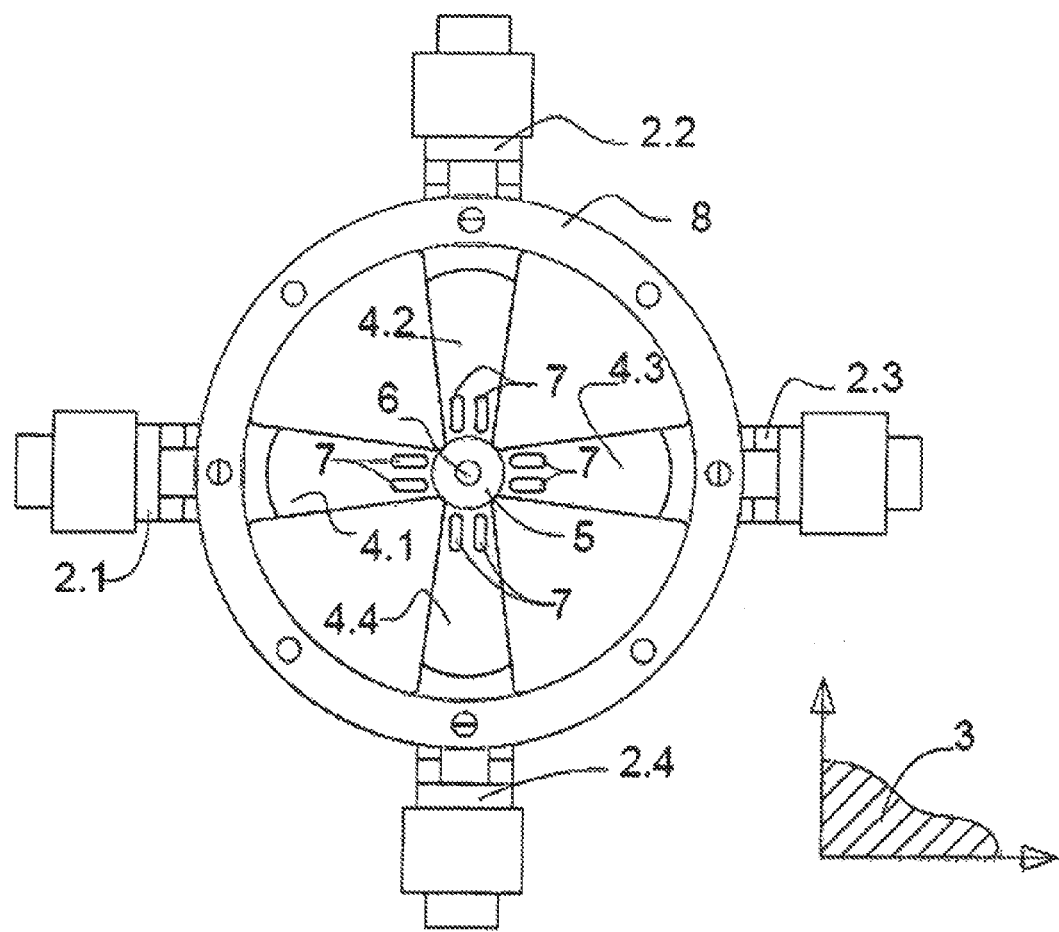
FIG. 1 is a top view of an ultrasonic cross-transducer which is utilized with the present invention.

As essential functional components, the ultrasonic cross-transducer 1 of FIG. 1 comprises four ultrasonic transducers 2.1, 2.2, 2.3, 2.4 for generating ultrasonic waves (ultrasonic oscillations), arms 4.1, 4.2, 4.3, 4.4 associated with the ultrasonic transducers and extending in a working plane 3 of the ultrasonic cross-transducer 1, a receptacle 5 provided at a connection point 6 of the arms 4.1, 4.2, 4.3, 4.4 for a non-illustrated ultrasonic tool as well as a ring 8 carrying the ultrasonic transducers 2.1, 2.2, 2.3, 2.4, the arms 4.1, 4.2, 4.3, 4.4 as well as the receptacle 5. Two of the four ultrasonic transducers 2.1, 2.2, 2.3, 2.4 are associated with each other in pairs at an angle of 180°. The ring 8 is provided above the ultrasonic transducers 2.1, 2.2, 2.3, 2.4 and arms 4.1, 4.2, 4.3, 4.4 arranged in the working plane 3. The ring 8 in this case extends parallel to the working plane 3.

In the area of the connection point 6, the ultrasound-conducting arms 4.1, 4.2, 4.3, 4.4 have recesses 7 formed like slotted holes in the working plane 3. By providing the recesses 1, the ends of the arms 4.1, 4.2, 4.3, 4.4 facing the connection point 6 act as flexure joints. The flexure joints are used for supporting the receptacle 5 and the tool as well as the decoupling of the orthogonally arranged arms.

To generate the ultrasonic friction welding oscillation, the ultrasonic transducers (2.1, 2.2, 2.3, 2.4) are induced electrically such that a mechanical longitudinal oscillation is formed, which is conducted along the arms 4.1, 4.2, 4.3, 4.4 that conduct the ultrasound to the connection point 6 that forms the receptacle 5, is brought together there and is transferred to the not-shown ultrasonic tool that protrudes at a right angle from the working plane 3 in the direction of the substrate. For this purpose, the ultrasonic transducers 2.1, 2.2, 2.3, 2.4 usually have a piezo element that is electrically excitable to ultrasonic oscillations, or preferably a stack of piezo elements. According to the invention, the ultrasonic wave consists of a first harmonic oscillation component and a second, for example also harmonic, second oscillation component. At these excitation frequencies, the transducers 2.1, 2.2, 2.3, 2.4 must oscillate in resonance for at least the first excitation frequency and have a sufficiently low impedance for the higher frequency. In another advantageous embodiment, the transducer 2.1, 2.2, 2.3, 2.4 oscillates in resonance with nearly identical impedances for both excitation frequencies.

Usually ultrasonic transducers 2.1, 2.3 and 2.2, 2.4 that are located opposite each other, i.e., arranged rotated by 180° to each other, are induced to oscillate such that the first harmonic oscillation component is formed phase-shifted by 180° versus the ultrasonic transducer located opposite thereto. The first oscillation components of associated ultrasonic transducers 2.1, 2.2, 2.3, 2.4 offset to each other by 90° usually have a phase offset of 90°. For example, a first ultrasonic transducer 2.1 is induced with regard to the first harmonic oscillation component to a sine oscillation, a second ultrasonic transducer 2.3 is exactly in the counter-phase thereto, i.e., phase-shifted by 180°, a third ultrasonic transducer 2.2 is induced to a cosine oscillation and a fourth ultrasonic transducer 2.4 exactly counter-phase to the cosine oscillation. At least one ultrasonic transducer 2.1, 2.2, 2.3, 2.4 also has a second oscillation component, such as a harmonic second oscillation component with an oscillation amplitude that is smaller than the oscillation amplitude of the first oscillation component of the same ultrasonic transducer 2.1, 2.2, 2.3, 2.4.

Figure 2:
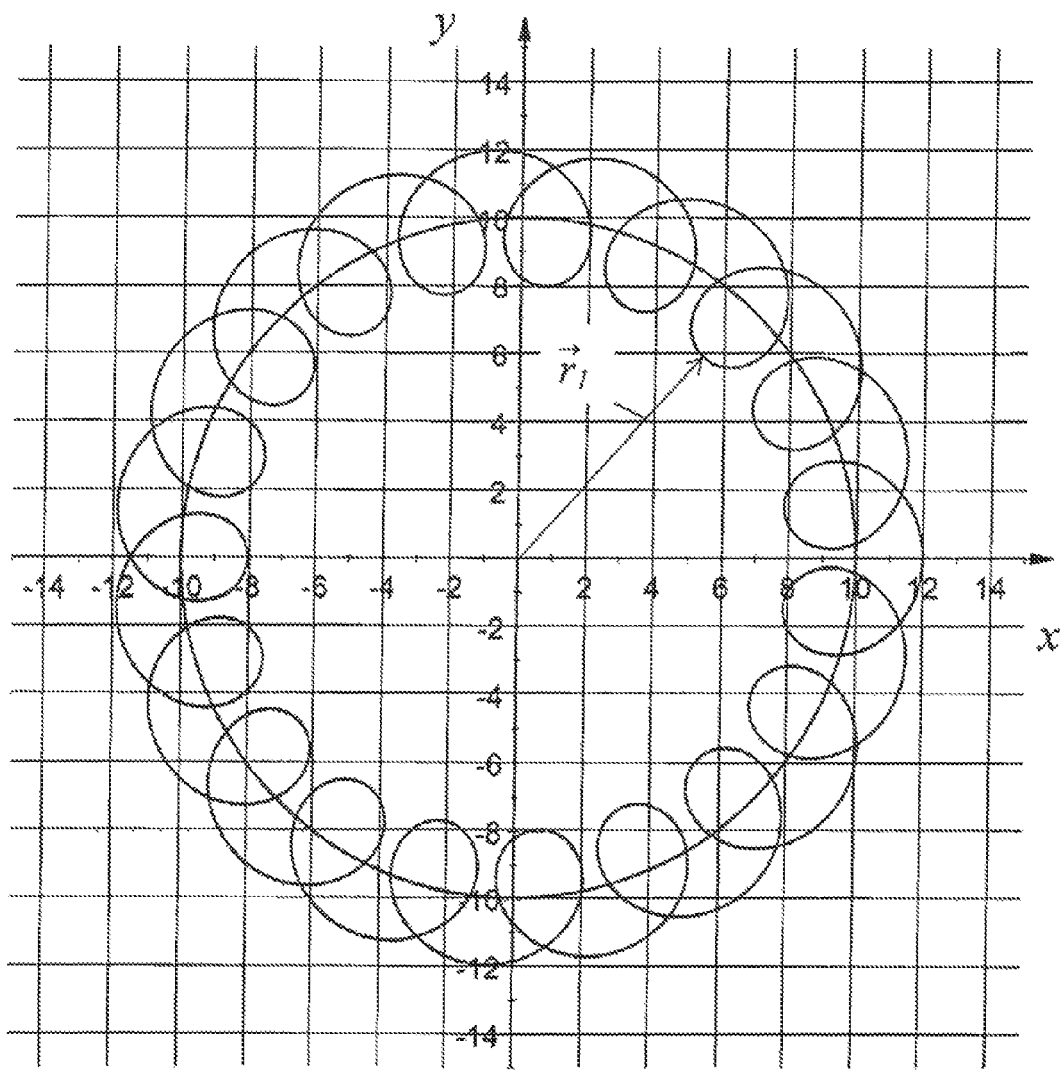
FIG. 2 shows a tool trajectory during operation of the transducer of FIG. 1 using a method according to a first embodiment of the invention.
Figure 3:
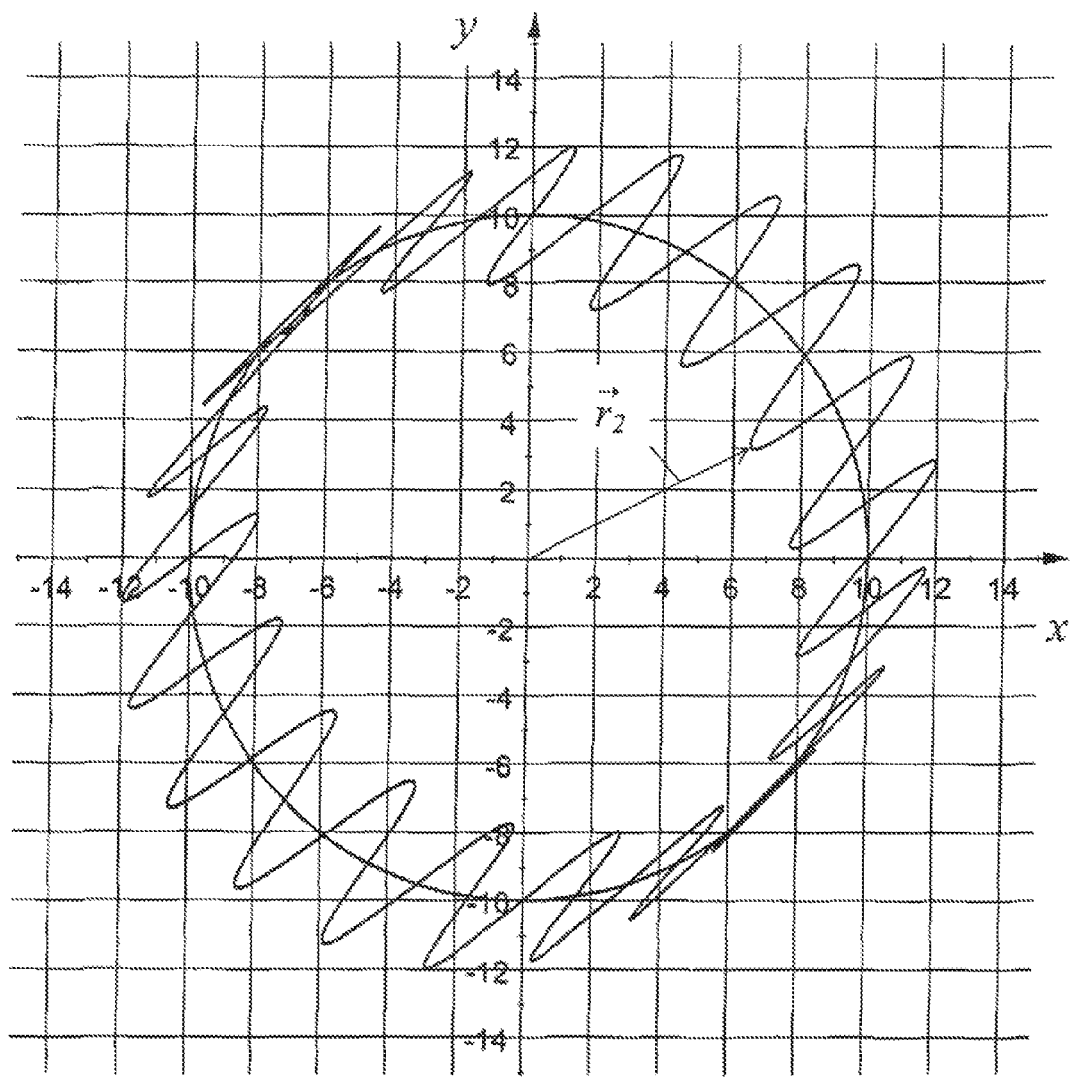
FIG. 3 shows a tool trajectory during operation of the transducer of FIG. 1 using a method according to a second embodiment of the invention.
Figure 4:
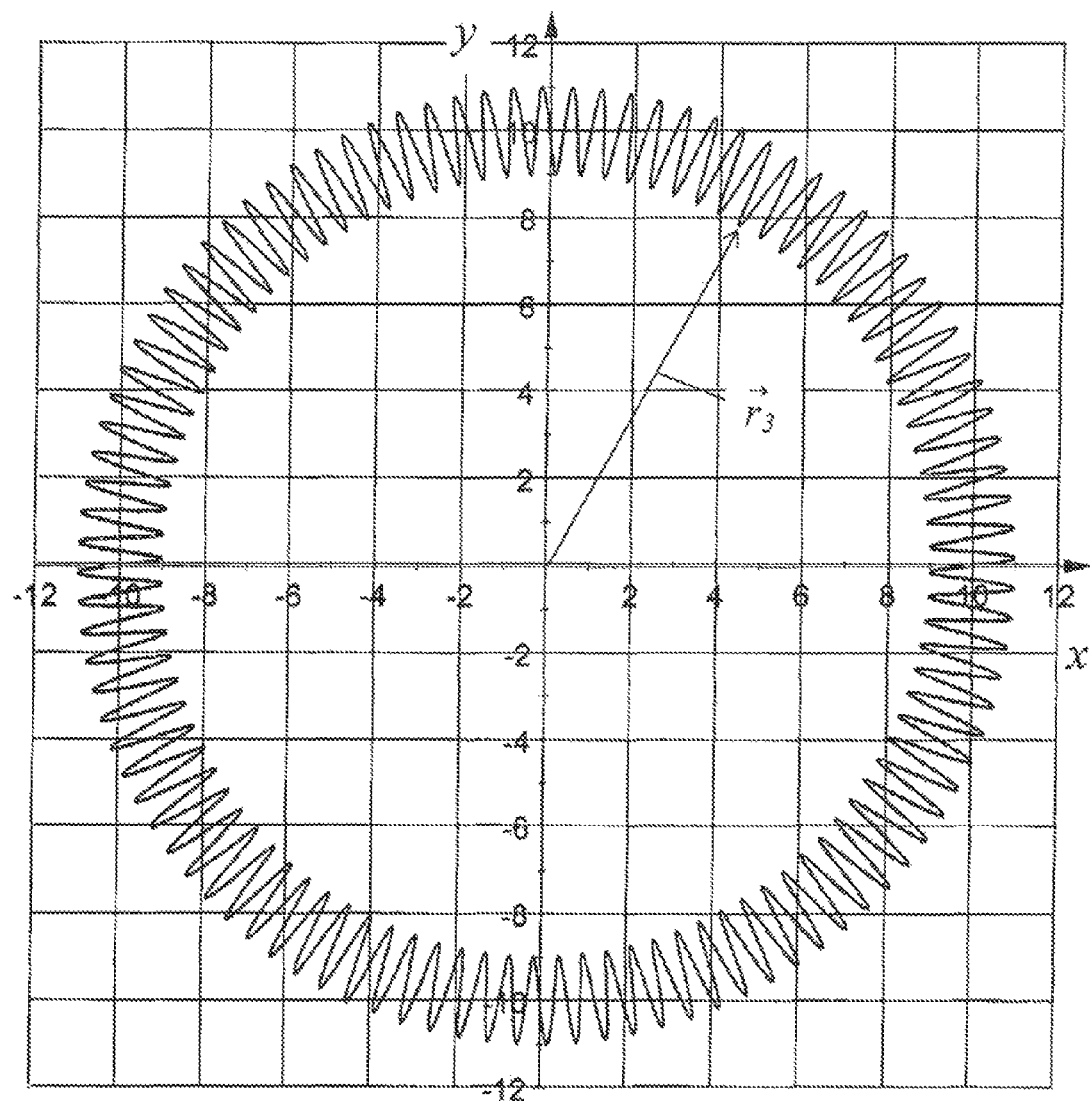
FIG. 4 shows a tool trajectory during operation of the transducer of FIG. 1 using a method according to a third embodiment of the invention.

The following exemplary embodiments of the invention, which are explained in greater detail with reference to FIGS. 2 to 4, provide a transducer with two, preferably four ultrasonic transducers 2.1, 2.2, 2.3, 2.4 offset by 90° to each other. Based on its control, each ultrasonic transducer 2.1, 2.2, 2.3, 2.4 generates an ultrasonic wave having a first harmonic and a second harmonic oscillation component. The ultrasonic waves of the four ultrasonic transducers 2.1, 2.2, 2.3, 2.4 are guided to the connection point 6 by the associated ultrasonic arms 4.1, 4.2, 4.3, 4.4, and there brought together. The tool (not shown) held in the receptacle 5 will carry out handing oscillations as a result of excitation by the ultrasonic waves.

To demonstrate the excitation, the two-dimensional movement of a free end of the tool that faces the substrate is visualized below. Here, the graph presented in the graphs of FIGS. 2 to 4 represents the movement of the tool tip (tool trajectory).

According to the tool trajectory shown in FIG. 2, a first, low-frequency oscillation component with a large oscillation amplitude A1 and a second oscillation component with a 25× greater frequency Ω2 and about 0.2 times the amplitude A2 is shows. The tool trajectory is formed by a circular path associated with the first oscillation component and a superimposed helical path associated with the second oscillation component. It can be recognized clearly that the resulting tool movement leads to a path distance that is significantly greater than is the case with only the excitation with the low frequency oscillation component and the large oscillation amplitude A1. Since the greater distance is traversed in the same time, the welding power increases.

In the illustrated coordinate system, the locus of the tool is defined by the equation $$\vec{r}_1(t) = \begin{pmatrix} x(t) \\ y(t) \end{pmatrix} = A_1 \begin{pmatrix} \cos(\Omega_1 t) \\ \sin(\Omega_1 t) \end{pmatrix} + A_2 \begin{pmatrix} \cos(\Omega_2 t) \\ \sin(\Omega_2 t) \end{pmatrix}$$

Here A1 corresponds to the amplitude of the first harmonic oscillation component, A2 to the amplitude of the second harmonic oscillation component, Ω1 to the frequency of the first harmonic oscillation component and Ω2 to the frequency of the second harmonic oscillation component.

The locus shown is produced by additive superimposition of the two oscillation components. The x-coordinate of the locus is induced by the two ultrasonic transducers 2.1, 2.3 located opposite each other and controlled phase-offset by 180°, the y-coordinates, by the two ultrasonic transducers 2.2, 2.4 oriented offset to each other by 90°.

FIG. 3 shows a similarly generated tool trajectory, the locus of which follows the equation $$\vec{r}_2(t) = \begin{pmatrix} x(t) \\ y(t) \end{pmatrix} = A_1 \begin{pmatrix} \cos(\Omega_1 t) \\ \sin(\Omega_1 t) \end{pmatrix} + A_2 \begin{pmatrix} \sin(\Omega_2 t) \\ \sin(\Omega_2 t) \end{pmatrix}$$

and does without orthogonal signals of the ultrasonic transducer 2.1, 2.2, 2.3, 2.4 that are arranged at a right angle to each other in the second oscillation component. Instead, the higher frequencies in the adjacent ultrasonic transducers 2.1, 2.2, 2.3, 2.4 are controlled in phase. The corresponding control can be implemented relatively easily, since it can do without a respective phase control of the higher frequencies.

According to FIG. 4, the ultrasonic wave is not formed by the addition of two oscillation components, but by a multiplicative superimposition of the two oscillation signals in accordance with the equation $$\vec{r}_3(t) = \begin{pmatrix} x(t) \\ y(t) \end{pmatrix} = \begin{pmatrix} (A_1 + A_2\sin(\Omega_2 t)) \cdot \cos(\Omega_1 t) \\ (A_1 + A_2\sin(\Omega_2 t)) \cdot \sin(\Omega_1 t) \end{pmatrix}$$

Multiplying has as a result the following form for the locus:

$$\begin{pmatrix} x(t) \\ y(t) \end{pmatrix} = \begin{pmatrix} (A_1\cos(\Omega_1 t) + \frac{A_2}{2}[\sin((\Omega_2 - \Omega_1)t) + \sin((\Omega_2 + \Omega_1)t)] \\ (A_1\sin(\Omega_1 t) + \frac{A_2}{2}[\cos((\Omega_2 - \Omega_1)t) - \cos((\Omega_2 + \Omega_1)t)] \end{pmatrix}$$

It is shown that the ultrasonic wave has a first oscillation component, a second oscillation component and a third oscillation component. The three oscillation components are each designed harmonically with the first oscillation component having a large amplitude A1 and a low frequency Ω1.

The second and the third oscillation components have an equal amplitude A2. However, they differ with regard to the frequency. The second oscillation component has the frequency Ω2−Ω1, the third oscillation component the frequency Ω2+Ω1. Here, in the graphic presentation of FIG. 4, Ω2 is selected to be greater than Ω1 by a factor of about 100, with the result that the frequencies Ω2−Ω1, Ω2+Ω1 of the second and third oscillation component are very close to each other.

According to an alternative embodiment of the invention (not shown), three ultrasonic transducers 2.1, 2.2, 2.3 can be arranged in the common working plane 3, spatially offset by 120°. The three ultrasonic transducers 2.1, 2.2, 2.3 are phase offset in time by 120° according to the known procedure to generate the first oscillation component. At least one of the three ultrasonic transducers 2.1, 2.2, 2.3 generates the second oscillation component.

This second oscillation component can be designed preferably harmonic and/or with higher-frequency compared to the first oscillation component.

There has thus been shown and described a novel method for ultrasonic bonding having at least one first and second ultrasonic transducer generating harmonic oscillation components which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

The invention claimed is:

1. A method for ultrasonic bonding, wherein two longitudinal ultrasonic waves propagating in a common working plane oriented parallel to a substrate are induced in one or more ultrasonic transducers and are passed through ultrasound-conducting arms from different spatial directions onto a common connection point of the arms, and at the connection point cause an ultrasonic tool arranged directly or indirectly at said connection point to oscillate in two or three dimensions, the improvement wherein at least one of said ultrasonic transducers induces a longitudinal ultrasonic wave with a first harmonic oscillation component and a second oscillation component having an ultrasound frequency different from that of said first oscillation component.

2. The method as in claim 1, wherein the at least one ultrasonic transducer induces the second oscillation component as a second harmonic oscillation component.

3. The method as in claim 1, wherein the at least one ultrasonic transducer induces the ultrasonic wave with a second oscillation component that has a higher-frequency compared to the first harmonic oscillation component.

4. The method as in claim 1, wherein the at least one ultrasonic transducer induces the first harmonic oscillation component with a first oscillation amplitude and the second oscillation component with a second oscillation amplitude that is smaller compared to the first oscillation amplitude.

5. The method as in claim 1, wherein at least one first ultrasonic transducer induces a first ultrasonic wave with a first harmonic oscillation component and with a second oscillation component and at least a second ultrasonic transducer induces a second ultrasonic wave with at least a first harmonic oscillation component and with a second harmonic oscillation component, wherein arms associated with adjacent ultrasonic transducers are arranged in the working plane at an angle of 30° to 150° to each other.

6. The method as in claim 1, wherein the first ultrasonic transducer and the second ultrasonic transducer each generate an ultrasonic wave, wherein the arm associated with the first ultrasonic transducer and the arm associated with the second ultrasonic transducer are arranged at an angle of 90° to each other and wherein the second oscillation component of the first ultrasonic wave is formed orthogonal to the second oscillation component of the second ultrasonic wave.

7. The method as in claim 1, wherein the at least one ultrasonic transducer induces the ultrasonic wave with a third oscillation component having an ultrasound frequency different from that of said first and second oscillation components.

8. The method as in claim 7, wherein the at least one ultrasonic transducer induces the third oscillation component as a third harmonic oscillation component.

9. The method as in claim 7, wherein the at least one ultrasonic transducer induces the ultrasonic wave with a third harmonic oscillation component that has a higher frequency compared to the second harmonic oscillation component.

10. The method as in claim 7, wherein the at least one ultrasonic transducer induces the second oscillation component and the third oscillation component with an equal oscillation amplitude.

11. The method as in claim 7, wherein the at least one ultrasonic transducer is arranged to generate the first harmonic oscillation component of the ultrasonic wave with oscillations in a first natural characteristic frequency and to generate the second oscillation component and/or the third oscillation component of the ultrasonic wave with oscillations in at least one additional natural characteristic frequency of a higher order.

* * * * *